(12) United States Patent
Chen et al.

(10) Patent No.: US 10,345,692 B2
(45) Date of Patent: Jul. 9, 2019

(54) PHOTOMASK AND A FABRICATION METHOD THEREFOR

(71) Applicant: TAIWAN SEMICONDUCTOR MANUFACTURING COMPANY, LTD., Hsinchu (TW)

(72) Inventors: Chun-Lang Chen, Madou Township (TW); Chih-Chiang Tu, Tauyen (TW); Shih-Hao Yang, Tainan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 106 days.

(21) Appl. No.: 15/399,205

(22) Filed: Jan. 5, 2017

(65) Prior Publication Data

US 2018/0149960 A1    May 31, 2018

Related U.S. Application Data

(60) Provisional application No. 62/427,643, filed on Nov. 29, 2016.

(51) Int. Cl.
*G03F 1/26* (2012.01)
*G03F 1/28* (2012.01)
*H01L 21/033* (2006.01)

(52) U.S. Cl.
CPC .................. *G03F 1/26* (2013.01); *G03F 1/28* (2013.01); *H01L 21/0332* (2013.01); *H01L 21/0335* (2013.01); *H01L 21/0337* (2013.01); *H01L 21/0338* (2013.01)

(58) Field of Classification Search
CPC ..................................... G03F 1/26; G03F 1/28
USPC ............................................................ 430/5
See application file for complete search history.

(56) References Cited

U.S. PATENT DOCUMENTS

2008/0020299 A1* 1/2008 Lee .................. B29D 11/00365
430/5

* cited by examiner

*Primary Examiner* — Christopher G Young
(74) *Attorney, Agent, or Firm* — Hauptman Ham, LLP

(57) ABSTRACT

A method of fabricating a photomask includes depositing a phase shifter over a light transmitting substrate, depositing a shading layer over the light transmitting substrate, and removing a portion of the shading layer and a portion of the phase shifter to expose a portion of the light transmitting substrate. The phase shifter having at least two semiconductor layers and at least two dielectric layers.

20 Claims, 5 Drawing Sheets

PHOTOMASK AND A FABRICATION METHOD THEREFOR

BACKGROUND

Photolithography is utilized in the fabrication of semiconductor devices to transfer a pattern onto a wafer. Based on various integrated circuit (IC) layouts, patterns are transferred from a photomask to a surface of the wafer. The photomasks, also called reticles, are made of quartz or glass with one or more metallic materials deposited on one side to prevent light penetration. As dimensions decrease and density in IC chips increases, resolution enhancement techniques, such as optical proximity correction (OPC), off-axis illumination (OAI), double dipole lithography (DDL) and phase-shift mask (PSM), are developed to improve depth of focus (DOF) and therefore to achieve a better pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
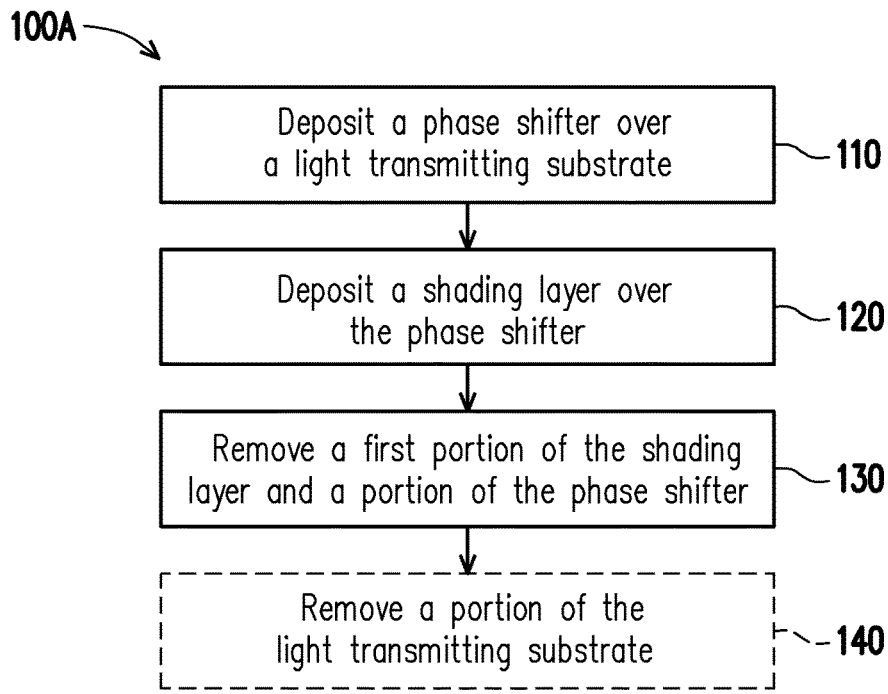
FIG. 1A is a flow chart of a method of fabricating a photomask in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor device feature sizes have decreased to be smaller than a wavelength of light used in photolithography processes, the ability of manufacturing the minimum feature size, also called critical dimensions (CD), become sensitive to optical fringing of light passing through a photomask or a reticle. Because of constructive and destructive interference effects, also referred to as diffraction, photoresist at an edge of a defined pattern is exposed under undesired light, resulting in a distortion in a pattern transferred to a wafer. In order to enhance a resolution during the image transfer, a phase shift mask (PSM) is used to shift a phase of selected light passing through the photomask or the reticle by π (180 degrees), thereby the undesired light is scattered or offset by the destructive interference. Removing the undesired light helps to improve the precision of the image transfer. Typically, the PSM is categorized into an alternating PSM or an attenuated PSM. The alternating PSM induces the phase shift of light by adjusting a thickness of a clear region. The attenuated PSM allows a small percentage of light to penetrate through a dark region. In some instances, each PSM includes molybdenum silicide (MoSi) as a phase shifter. Defects such as crystal haze and particles are generated after a series process including UV exposure, baking and cleaning by sulfuric acid and ammonia, thereby causing a greater CD error and decreasing manufacturing yield.

In some embodiments, in order to reduce a growth of crystal haze, a combination of a semiconductor layer, such as silicon, and a dielectric layer, such as silicon dioxide, is used in place of MoSi. In some embodiments, the phase shifter includes from 2 to 12 semiconductor/dielectric layer pairs. Based on a control of etch selectivities, such a phase shifter has an improved profile during an etch process and a reduced CD loss during the photolithography process. In some embodiments, a bottom layer of the phase shifter has a relatively lower etch rate during the etch process. As a result, an unetched protrusion is formed between the phase shifter and a transparent substrate. The unetched protrusion enhances a physical damage resistance of the phase shifter to a subsequent clean process.

FIG. 1A is a flow chart of a method 100A of fabricating a photomask in accordance with one or more embodiments. One of ordinary skill in the art would understand that additional operations are able to be performed before, during, and/or after method 100A depicted in FIG. 1A, in some embodiments. Method 100A includes operation 110 in which a phase shifter is deposited over a light transmitting substrate. A selected single wavelength or waveband is intended to penetrate through the light transmitting substrate. In some embodiments, the light transmitting substrate is deemed transparent under near ultra violet (NUV) wavelengths (e.g., less than 365 nanometers (nm)). In some embodiments, the light transmitting substrate is deemed transparent under deep ultra violet (DUV) wavelengths (e.g., less than 284 nm). In some embodiments, the light transmitting substrate is deemed transparent under argon fluoride (ArF) laser (e.g., 193 nm). The phase shifter, also referred to as a semi-light transparent phase shifter, is used to change a phase of light transmitted by the light transmitting substrate. The phase shifter includes a plurality of semiconductor layers and a plurality of dielectric layers arranged in an alternating fashion. The semiconductor layer and the dielectric layer have different etch selectivities. In some embodiments, the formation of the phase shifter includes a deposition process and an etch process performed cyclically.

Figure 1B:
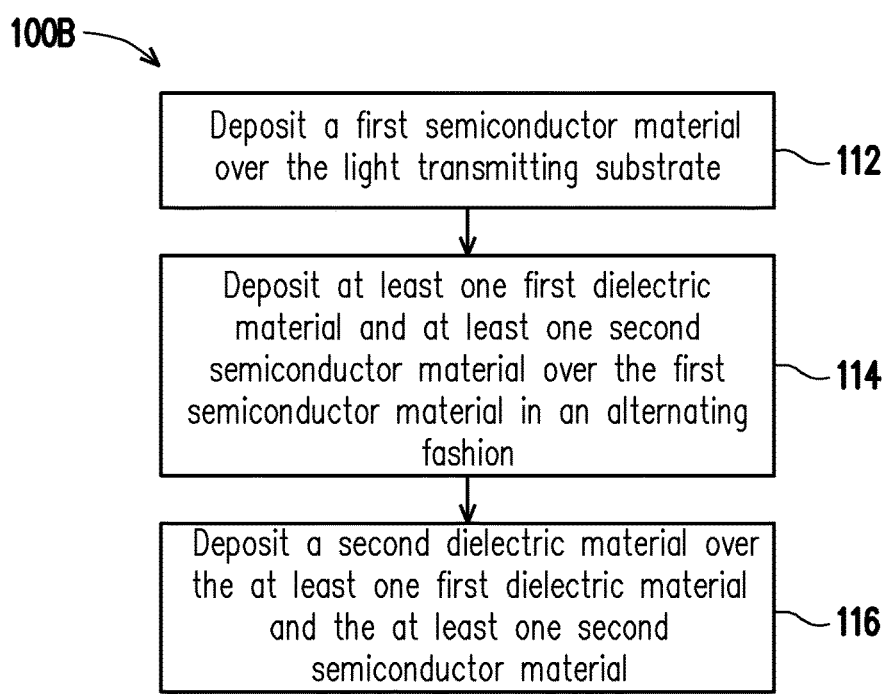
FIG. 1B is a flow chart of a method of forming a phase shifter in accordance with one or more embodiments.

FIG. 1B is a flow chart of a method 100B of forming a phase shifter in accordance with one or more embodiments. One of ordinary skill in the art would understand that additional operations are able to be performed before, during, and/or after method 100B depicted in FIG. 1B, in some embodiments. Method 100B includes operation 112 in which a first semiconductor layer is deposited over the light transmitting substrate. The first semiconductor layer is used to endure an ion bombardment and therefore prevent a bottom portion of the phase shifter from being over etched. In some embodiments, the first semiconductor layer includes silicon, germanium, silicon germanium, silicon carbide or another suitable material. In some embodiments, the formation of the first semiconductor includes a deposition process, such as a chemical vapor deposition (CVD).

In operation 114, at least one first dielectric layer and at least one second semiconductor layer are deposited, in an alternating fashion, over the first semiconductor layer. When more than one second semiconductor layer is deposited, in some embodiments, each of the second semiconductor layers includes the same material. In some embodiments, at least one second semiconductor layer is different from the first semiconductor layer or another second semiconductor layer. In some embodiments, each of the at least one second semiconductor layer includes the same material as the first semiconductor layer. For example, the first semiconductor layer includes silicon and the at least one second semiconductor layer includes germanium. In some embodiments, the formation process of the second semiconductor layer includes plasma-enhanced CVD (PECVD), high-density plasma CVD (HDPCVD), low pressure CVD (LPCVD) or another suitable process.

In some embodiments, the at least one first dielectric layer includes a single dielectric layer. In some embodiments, the at least one first dielectric layer includes multiple dielectric layers adjacent one another, for example, a silicon nitride layer and a silicon oxide layer without an intervening semiconductor layer. In some embodiments, the formation of the at least one first dielectric layer includes the same deposition process as that used to form the second semiconductor layer. In some embodiments, the formation of the at least one first dielectric layer includes a different deposition process from that used to form the second semiconductor layer. For example, the first dielectric layer uses a CVD process and the second semiconductor layer uses an atomic layer deposition (ALD) process. In some embodiments, each of the at least one first dielectric layer is formed by the same process. In some embodiments, at least one of the first dielectric layer is formed by a different process from another. In some embodiments, each of the at least one first dielectric layer has a same material. In some embodiments, at least one of the at least one first dielectric layer has a different material from another of the at least one first dielectric layer. In some embodiments, each of the at least one first dielectric layer is a single dielectric layer. In some embodiments, each of the at least one first dielectric layer includes multiple dielectric layers adjacent one another. In some embodiments, at least one of the at least one first dielectric layer is a single dielectric layer and another of the at least one first dielectric layer includes multiple dielectric layers adjacent one another.

In operation 116, a second dielectric layer is deposited over the at least one first dielectric layer and the at least one second semiconductor layer. In some embodiments, the second dielectric layer includes the same material as each of the at least one first dielectric layer. In some embodiments, the second dielectric layer includes a different material from at least one of the at least one the first dielectric layer. In some embodiments, the formation of the second dielectric layer is the same as that used to form the at least one first dielectric layer. In some embodiments, the formation of the second dielectric layer is different from that used to form the at least one first dielectric marital. For example, second dielectric layer uses a CVD process and the at least one first dielectric uses an ALD process. Based on the photolithographic parameters, a thickness and a refraction index of the phase shifter is determined by selecting the material and formation of the first semiconductor layer, the at least one second semiconductor layer, the at least one first dielectric layer and the second dielectric layer.

Figure 2A:
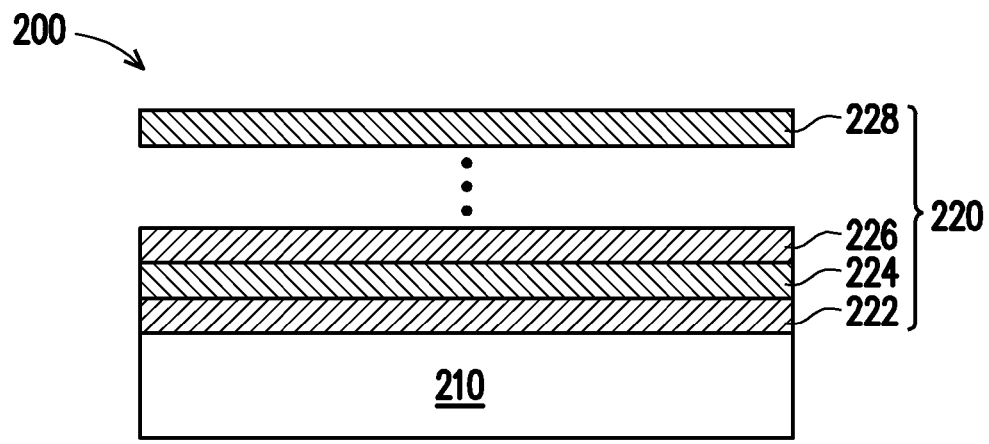
FIGS. 2A-2E are cross-sectional views of a photomask at various stages of production in accordance with one or more embodiments.

FIG. 2A is a cross-sectional view of a photomask 200 following operation 110 in accordance with one or more embodiments. Photomask 200 includes a light transmitting substrate 210 and a phase shifter 220. In some embodiments, light transmitting substrate 210 is formed of glass, fused silica, quartz, calcium fluoride, sapphire or another suitable material. In some embodiments, a thickness of light transmitting substrate 210 ranges from about 0.09 inches for a five-inch mask to about 0.25 inches for a six-inch mask If the thickness is too small, photomask 200 will be fragile and a risk of cracking or breaking during handling photomask 200 increases, in some instances. If the thickness is too great, a cost of light transmitting substrate 210 will increase without a significant increase in functionality, in some instances.

Phase shifter 220 includes a first semiconductor layer 222, a first dielectric layer 224, a second semiconductor layer 226 and a second dielectric layer 228. In some embodiments, photomask 200 includes one or more semiconductor layers or dielectric layers stacked between second semiconductor layer 226 and second dielectric layer 228 in an alternating fashion. In some embodiments, including layers 222-228, phase shifter 220 has from 2 to 12 semiconductor/dielectric pairs, collectively referred to as pairs P. If a quantity of pairs P is too small, a sidewall of a subsequently etched phase shifter 220 will have a notch or have a tapered shape, in some instances. If a quantity of pairs P is too great, a cost of manufacturing phase shifter 220 will increase without a significant increase in functionality, in some instances.

In some embodiments, first semiconductor layer 222, second semiconductor layer 226 and other semiconductor layers within phase shifter 220, collectively referred to as semiconductor layers S, independently include silicon, germanium, silicon germanium, silicon carbide or another suitable material. In some embodiments, first dielectric layer 224, second dielectric layer 228 and other dielectric layers within phase shifter 220, collectively referred to as dielectric layers D, independently include silicon dioxide, silicon nitride, silicon oxynitride or another suitable material. In some embodiments, each layer of dielectric layer D includes a single layer. In some embodiments, each layer of dielectric layers D includes multiple layers, for example, a combination of silicon dioxide and silicon nitride. The quantity of pairs P and the material selected for semiconductor layers S and for dielectric layers D are adjustable based on various parameters required in the photolithography process, such as transmittance, optical density, refractive index or critical dimension (CD) loss. In at least one embodiment where each layer of semiconductor layers S is silicon, each layer of dielectric layer D includes silicon dioxide or silicon nitride.

The formation of phase shifter 220 includes a deposition process, such as ALD or CVD.

In some embodiments, a thickness of each semiconductor layer S independently ranges from about 1 nm to about 5 nm. If the thickness is too small, phase shifter 220 will suffer more damage during the subsequent clean or etch process, in some instances. If the thickness is too great, a transmittance of phase shifter 220 will decrease, in some instances. In some embodiments, each of semiconductor layer S has the same thickness. In some embodiments, at least one of semiconductor layer S has a different thickness from another semiconductor layer. In some embodiments, a thickness of each dielectric layer D independently ranges from about 10 nm to about 20 nm. If the thickness of a dielectric layer is too great, a sidewall of the subsequently etched phase shifter 220 will be irregular, in some instances. If the thickness of a dielectric layer is too small, an optical property of phase shifter 220 will be hard to control, in some instances. In some embodiments, each of dielectric layer D has the same thickness. In some embodiments, at least one of dielectric layer D has a different thickness from another dielectric layer. In some embodiments, when photomask 200 is an attenuated PSM, a total transmission rate incident light of phase shifter 220 ranges of from about 6% to 18%, in some instances. If the transmission rate is too great or too small, an intensity amplitude of phase-shifted light will be too much or insufficient, so the resolution enhancement of the image to be transferred will decrease, in some instances. Based on the inherent physical property and etching method, semiconductor layers S have a lower etch rate than dielectric layer D. For example, during a dry etch process, because silicon endures greater ion bombardments than silicon dioxide or silicon nitride, silicon has a lower etch rate than silicon dioxide or silicon nitride. Therefore, the sidewall profile is improved because of a multilayer structure with a combination of silicon and silicon dioxide/silicon nitride. In some embodiments, a ratio of etch rates between dielectric layer D and semiconductor layer S ranges from about 1.5 to about 2.5. If the ratio is too great, a loss of dielectric layer D will increase resulting in distortion of the image to be transferred, in some instances. If the ratio is too small, a manufacturing cost of photomask 200 will increase, in some instances.

Returning to FIG. 1A, method 100A continues with operation 120 in which a shading layer is deposited over the phase shifter. The shading layer acts as a light absorber in the photomask. In some embodiments, the shading layer includes a metal material. In some embodiments, the shading layer includes a metal material and an oxide material. In some embodiments, the shading layer includes a metal material and a metal oxide gradient. In some embodiments, the metal oxide gradient or a metal is used to reduce reflectivity during the photolithography process.

Figure 2B:
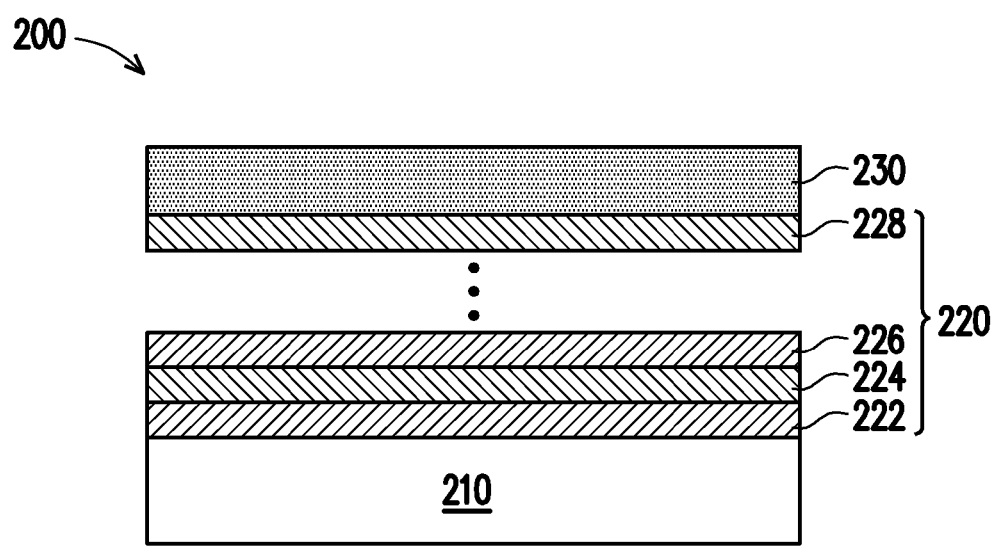

FIG. 2B is a cross-sectional view of photomask 200 following operation 120 in accordance with one or more embodiments. A shading layer 230, also referred to as an opaque layer, is over phase shifter 220. In some embodiments, shading layer 230 includes chromium, chromium oxide, chromium oxynitride or another suitable material. The formation of shading layer 230 includes a deposition process, such as sputtering, CVD, physical vapor deposition (PVD), ALD or another suitable process. A thickness of shading layer 230 is based on various designs of photomasks. In some embodiments, when photomask 200 is the attenuated PSM, the thickness of shading layer 230 ranges from about 40 nm to about 65 nm, in some instances. If the thickness is too great, an intensity of phase-shifted light penetrating through shading layer 230 decreases, in some instances. If the thickness is too small, a side lobe of the photoresist will be affected by phase-shifted light resulting in distortion of the image to be transferred, in some instances. In some embodiments, when photomask 200 is an alternating PSM, the thickness of shading layer 230 is greater than 100 nm, in some instances. If the thickness is too small, an amount of light absorption will be insufficient, in some instances. Similarly, an ability of light phase shifter 220 and/or shading layer 230 to absorb or block the passage of light, also referred to as an optical density, is based on various designs of photomasks. For example, for the alternating PSM, the optical density of a combination of shading layer 230 and phase shifter 220 is greater than 3. If the optical density is too small, the light blockage will be insufficient, in some instances.

Returning to FIG. 1A, method 100A continues with operation 130 in which a first portion of the shading layer and a portion of the phase shifter are removed to expose a portion of the light transmitting substrate. In some embodiments, a first mask layer is formed over the shading layer to define a first pattern. Next, a first portion of the shading layer and a portion of the phase shifter thereunder are removed to expose a portion of the light transmitting substrate. Such formation includes a photolithography and an etch process. In some embodiments, the removal of the first portion of the shading layer and the portion of the phase shifter thereunder uses laser-beam writing to expose the portion of the light transmitting substrate.

Figure 2C:
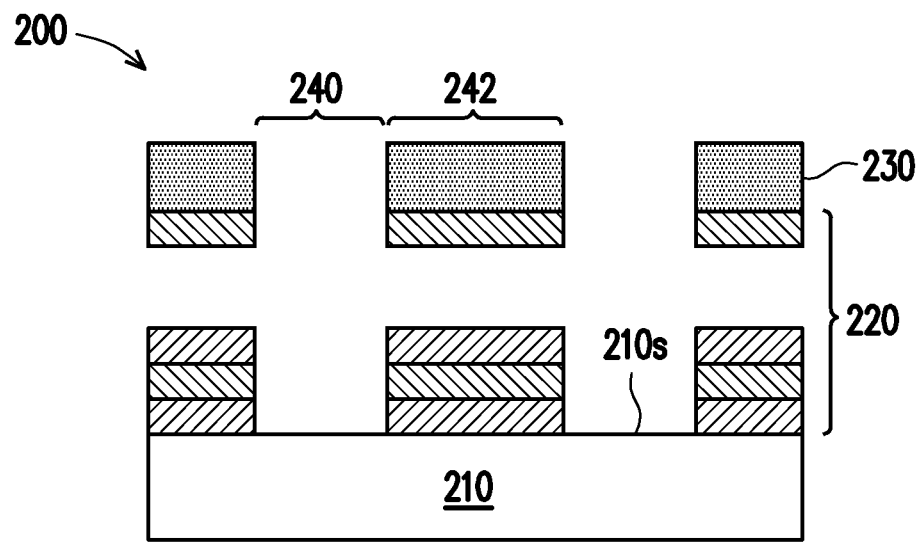

FIG. 2C is a cross-sectional view of photomask 200 following operation 130 in accordance with one or more embodiments. In some embodiments, a first photoresist is formed and patterned over shading layer 230, followed by an etch process to remove a first portion of shading layer 230. Next, shading layer 230 is used as a hard mask for a removal of a portion of phase shifter 220. As a result, a portion of light transmitting substrate 210 is exposed. Alternatively, the portion of shading layer 230 and the portion of phase shifter 220 are removed in the same etch process. In some embodiments, a region 240 of an exposed light transmitting substrate 210s is referred to as a clear tone and a region 242 of phase shifter 220 and shading layer 230 is referred to as a dark tone. In some embodiments, after operation 130, photomask 200 is referred to as the attenuated PSM. In some embodiments, the etch process includes a dry etching, such as a plasma etching, a wet etching or a combination of the dry etching and the wet etching. In some embodiment where the etch process is a plasma etching, an etchant gas includes a fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), or another suitable gases. For example, when the etchant gas is a mixture of $SF_6$ and oxygen, silicon has a relatively lower etch rate than silicon nitride and silicon dioxide. Because semiconductor layer S has a lower etch rate than dielectric layer D, semiconductor layer S acts as an ion-bombardment barrier during the etch process, in some instances. Therefore, photomask 200 has an improved sidewall profile relative to a conventional MoSi phase shifter, which helps to enhance the resolution and reduce CD error during the semiconductor manufacturing. In some embodiments, the removal process uses laser-beam writing.

In some embodiments, under an exposure energy of around 48,000 Joules, compared to layout designed patterns, an undesired CD growth of photomask 200 is smaller than 0.1 nm and an undesired CD loss of photomask 200 is smaller than 0.1 nm. In some embodiments, under an exposure energy of around 8,000 Joules, each photomask 200 is able to produce at least 25,000 wafers.

Figure 2D:
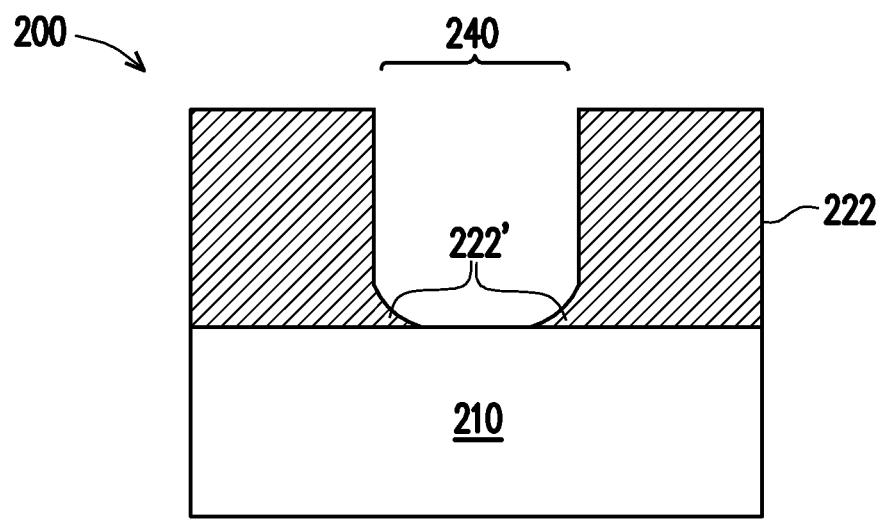

FIG. 2D is a schematic cross-sectional view of photomask 200 in accordance with one or more embodiments. After the removal process, a portion of unetched first semiconductor layer 222, also referred to as a protrusion 222', extends from a sidewall of first semiconductor layer 222 over light transmitting substrate 210. In some embodiments, protrusion 222' has a tapered profile. In some embodiments where protrusion 222' has a tapered profile, a thickness and a width of protrusion 222' ranges from about 0.1 nm to about 1 nm. If the thickness or the width is too great, a contrast between clear tone region 240 and dark tone region 242 will decrease, in some instances. If the thickness or the width is too small, a physical resistance during a subsequent clean or etch process will decrease, increasing a risk of collapse of phase shifter 220, in some embodiments. In some embodiments, each of semiconductor layer S forms a protrusion after the ion bombardment process. Similar to protrusion 222', each protrusion of semiconductor layer S has a thickness ranging from about 0.1 nm to about 1 nm and a width ranging from about 0.1 nm to about 1 nm.

Returning to FIG. 1A, method 100A continues with an optional operation 140 in which a portion of the light transmitting substrate is removed. In some embodiments, a second mask layer is formed over the shading layer and the exposed portion of the light transmitting substrate to define a second pattern. Next, a portion of the light transmitting substrate is removed to form a recess. Such formation includes a photolithography and an etch process.

Figure 2E:
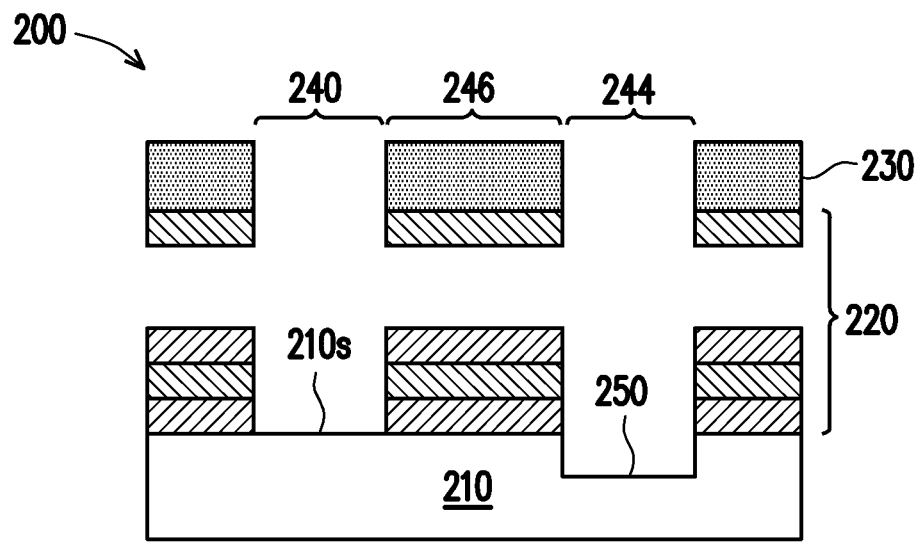

FIG. 2E is a cross-sectional view of photomask 200 following operation 140 in accordance with one or more embodiments. A second photoresist is formed and patterned over shading layer 230 and exposed light transmitting substrate 210s, followed by an etch process to remove a portion of light transmitting substrate 210. As a result, a recess 250 is formed in light transmitting substrate 210. In some embodiments, the removal of light transmitting substrate 210 uses the same process as the removal of shading layer 230 or phase shifter 220. In some embodiments, the removal of light transmitting substrate 210 uses a different process from the removal of shading layer 230 and phase shifter 220. A depth of recess 250 is selected based on a refraction index of light transmitting substrate and wavelength of incident light to realize a phase shift. In some embodiment, the depth of recess 250 ranges from about 1 nm to about 4 nm. A greater or smaller depth negatively affects a resolution of photomask 200, in some instances. In some embodiments, when photomask 200 is a tri-tone PSM, recess 250 is referred to as a phase shifting tone 244, exposed portion of light transmitting substrate 210s is referred to a clear tone, and a region of stacked phase shifter 220 and shading layer 230 is referred to as a dark tone 246. In some embodiments, according to different manufacturing requirements, shading layer 230 is partially or completely removed. In some embodiments, protrusion 222' (best seen in FIG. 2D) is at a sidewall of recess 250. Protrusion 222' has a sufficiently small roughness to avoid impacting the resolution of photomask 200.

Figure 3:
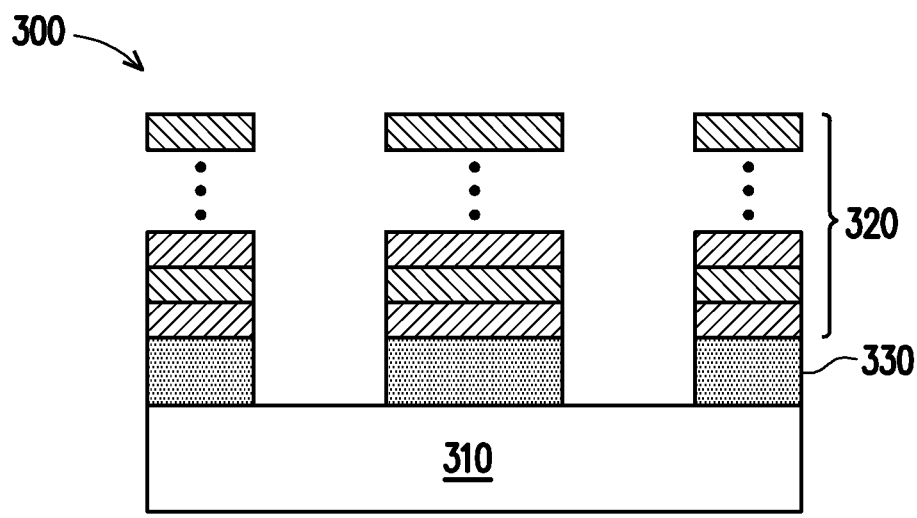
FIG. 3 is a cross-sectional view of a photomask in accordance with one or more embodiments.

FIG. 3 is a cross-sectional view of a photomask 300 in accordance with one or more embodiments. Photomask 300 is similar to photomask 200, like elements have a same reference number increased by 100. In contrast with photomask 200, a shading layer 330 is between a light transmitting substrate 310 and a phase shifter 320. In some embodiments, the formation of shading layer 330 and phase shifter 320 is the same as the formation of shading layer 230 and phase shifter 220. Photomask 300 is formed by adjusting an order of operations in method 100A, in some embodiments. For example, operation 120 is performed prior to operation 110.

Figure 4:
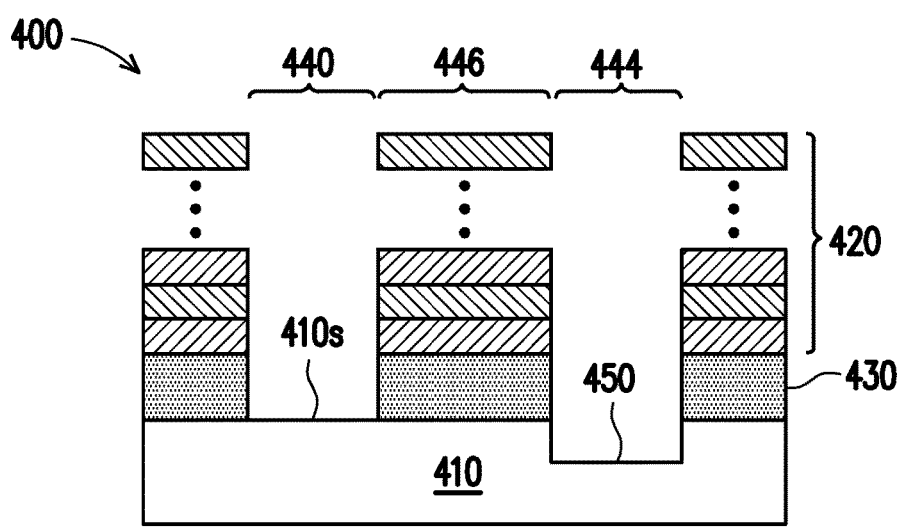
FIG. 4 is a cross-sectional view of a photomask in accordance with one or more embodiments.

FIG. 4 is a cross-sectional view of a photomask 400 in accordance with one or more embodiments. Photomask 400 is similar to photomask 200, like elements have a same reference number increased by 200. In contrast with photomask 200 (best see in FIG. 2E), a shading layer 430 is between a light transmitting substrate 410 and a phase shifter 420. Similar to photomask 200, a recess 450 is formed in light transmitting substrate 410 to form a tri-tone PSM, in some instances. In some embodiments, the formation of recess 450 is the same as the formation of recess 250. In some embodiments, recess 450 is referred to a phase shifting tone region 444, unetched light transmitting substrate 410s is referred to a clear tone region 440, and a region of stacked phase shifter 420 and shading layer 430 is referred to as a dark tone region 446.

One of ordinary skill in the art would understand that photomasks 200-400 will undergo further processing to complete fabrication. For example, in at least one embodiment, a third mask layer is formed over the photomask to define a third pattern. As another example, a passivation layer is optionally deposited over photomasks 200-400 after operation 130 or 140 or (depending on various designs of photomasks) to repair defects generated during the manufacturing process.

The insertion of semiconductor layers with a relatively lower etch rate than dielectric layers helps keep a sidewall profile of phase shifter, resulting in an improved CD pattern during the photolithography process. In addition, a transmittance of the phase shifter is adjustable by various combinations of the semiconductor layer and dielectric layer. Further, comparing to molybdenum silicide-based material, the semiconductor layer, such as silicon, and the dielectric layer, such as silicon dioxide, help reduce CD increase caused by oxidation and reduce a risk of haze caused during clean process. Moreover, an un-etched protrusion of the bottom semiconductor layer enhances a damage resistance caused by a wet clean process, resulting in a reduced manufacturing cost and production yield.

One aspect of this description relates to a method of fabricating a photomask. The method includes depositing a phase shifter over a light transmitting substrate, depositing a shading layer over the light transmitting substrate, and removing a portion of the shading layer and a portion of the phase shifter to expose a portion of the light transmitting substrate. The phase shifter having at least two semiconductor layers and at least two dielectric layers.

Another aspect of this description relates to a method of fabricating a reticle. The method includes depositing a bottom silicon layer over a transparent substrate, depositing at least one silicon/dielectric pair over the bottom silicon layer, depositing a top dielectric layer over the at least one silicon/dielectric pair, depositing an opaque layer over the top dielectric layer, and removing a portion of the opaque layer, a portion of the top dielectric layer, a portion of the at least one silicon/dielectric pair and the bottom silicon layer to expose a portion of the transparent substrate.

Still another aspect of this description relates to a PSM. The PSM includes a light transmitting substrate, and a phase shifter over the light transmitting substrate. The phase shifter has from 2 to 12 pairs of semiconductor layers and dielectric layers stacked in an alternating fashion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a photomask, comprising:
depositing a phase shifter over a light transmitting substrate, the phase shifter having at least two semiconductor layers and at least two dielectric layers;
depositing a shading layer over the light transmitting substrate; and
removing a portion of the shading layer and a portion of the phase shifter to expose a portion of the light transmitting substrate.

2. The method of claim 1, wherein depositing the phase shifter over the light transmitting substrate comprises:
depositing a first semiconductor layer over the light transmitting substrate;
depositing at least one first dielectric layer and at least one second semiconductor layer over the first semiconductor layer in an alternating fashion; and
depositing a second dielectric layer over the at least one first dielectric layer and the at least one second semiconductor layer.

3. The method of claim 2, wherein depositing the first semiconductor layer or the second semiconductor layer comprises depositing silicon, germanium, silicon germanium or silicon carbide.

4. The method of claim 2, wherein depositing the first semiconductor layer comprises forming the first semiconductor layer to have a thickness ranging from about 1 nanometer (nm) to about 5 nm, and depositing the at least one second semiconductor layer comprises independently forming the at least one second semiconductor layer to have a thickness ranging from about 1 nm to about 5 nm.

5. The method of claim 2, wherein depositing the at least one first dielectric layer comprises depositing silicon dioxide, silicon nitride or silicon oxynitride, and depositing the second dielectric layer comprises depositing silicon dioxide, silicon nitride or silicon oxynitride.

6. The method of claim 2, wherein depositing the at least one first dielectric layer comprises independently forming the at least one first dielectric layer to have a thickness ranging from about 10 nm to about 20 nm, and depositing the second dielectric layer comprise forming the second dielectric layer to have a thickness ranging from about 10 nm to about 20 nm.

7. The method of claim 2, wherein depositing the at least one first dielectric layer and the at least one second semiconductor layer comprises:
depositing silicon nitride to be the at least one first dielectric layer; and
depositing silicon to be the at least one second semiconductor layer, wherein the silicon nitride has a greater etch rate than the silicon.

8. The method of claim 2, wherein depositing the second dielectric layer comprises:
forming the second dielectric layer to have a different material from at least one of the at least one first dielectric layer.

9. The method of claim 1, further comprising:
removing a portion of the exposed light transmitting substrate to form a recess.

10. The method of claim 1, wherein depositing the phase shifter comprises:
forming the phase shifter to have a thickness ranging from about 40 nm to about 65 nm.

11. The method of claim 1, wherein depositing the phase shifter comprises:
determining the phase shifter to have a transmission rate ranging from about 6% to 18% of incident light.

12. The method of claim 1, wherein removing the portion of the shading layer and the portion of the phase shifter comprises:
forming a protrusion at a bottom portion of the phase shifter.

13. The method of claim 1, wherein depositing the shading layer comprises:
depositing a chromium layer configured to absorb light.

14. A phase shift mask (PSM), comprising:
a light transmitting substrate; and
a phase shifter over the light transmitting substrate, wherein the phase shifter has from 2 to 12 pairs of semiconductor layers and dielectric layers stacked in an alternating fashion.

15. The PSM of claim 14, further comprises:
a protrusion extending from a sidewall of the phase shifter, wherein a thickness and a width of the protrusion ranges from about 0.1 nanometers (nm) to 1 nanometer nm.

16. A method of fabricating a photomask, comprising:
depositing a phase shifter over a light transmitting substrate, the phase shifter comprising a first semiconductor layer, at least one pair of a first dielectric layer and a second semiconductor layer over the first semiconductor layer, and a second dielectric layer over the at least one pair of the first dielectric layer and the second semiconductor layer;
depositing a shading layer over the phase shifter; and
removing a first portion of the shading layer and a portion of the phase shifter to expose a portion of the light transmitting substrate.

17. The method of claim 16, further comprising:
forming a protrusion on a bottom portion of each of the first semiconductor layer and the second semiconductor layer.

18. The method of claim 16, wherein depositing the shading layer comprises:
sputtering a chromium layer to have a thickness greater than 100 nanometers (nm).

19. The method of claim 16, further comprising:
removing a portion of the light transmitting substrate to induce a 7C phase shift.

20. The method of claim 16, further comprising removing at least a second portion of the shading layer from the phase shifter, wherein the second portion is different from the first portion.

* * * * *